United States Patent [19]
Kim et al.

[11] Patent Number: 5,876,864
[45] Date of Patent: Mar. 2, 1999

[54] FLUORENE-BASED ALTERNATING POLYMERS CONTAINING ACETYLENE GROUP AND ELECTROLUMINESCENCE ELEMENT USING THE SAME

[75] Inventors: Chung Yup Kim; Hyun Nam Cho; Dong Young Kim; Young Chul Kim; Jun Young Lee; Jai Kyeong Kim, all of Seoul, Rep. of Korea

[73] Assignee: Korea Institute of Science and Technology

[21] Appl. No.: 991,753

[22] Filed: Dec. 16, 1997

[30] Foreign Application Priority Data

Dec. 31, 1996 [KR] Rep. of Korea ................... 1996/82444

[51] Int. Cl.⁶ .................................................. H05B 33/00

[52] U.S. Cl. ........................ 428/690; 428/691; 428/917; 313/504

[58] Field of Search ..................................... 428/690, 691, 428/917; 313/504

[56] References Cited

U.S. PATENT DOCUMENTS 5,077,142 12/1991 Sakon et al. ............................. 428/690

*Primary Examiner*—Charles Nold
*Attorney, Agent, or Firm*—Ostrolenk, Faber, Gerb & Soffen, LLP

[57] ABSTRACT

The present invention relates to a fluorene-based alternating polymer having the following formula (I) to be used as light emitting materials of electroluminescent elements, and further relates to electroluminescent elements having an anode/luminescent layer/cathode structure, in which the fluorene-based alternating polymer is used as light emitting materials of the luminescent layer, or having a transporting and/or reflection layer added thereto, if necessary.

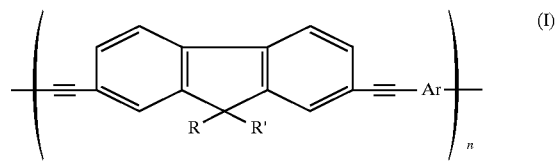

wherein R, R', X, Ar and n are defined as above.

5 Claims, 16 Drawing Sheets

FLUORENE-BASED ALTERNATING POLYMERS CONTAINING ACETYLENE GROUP AND ELECTROLUMINESCENCE ELEMENT USING THE SAME

BACKGROUND OF THE INVENTION

1. Field of the Invention

The present invention relates to fluorene-based alternating polymers to be used as luminescent materials in manufacturing macromolecular electroluminescence (EL) elements, and relates to EL elements using such fluorene-based alternating polymers as light emitting materials.

2. Description of the Prior Art

Examples of EL elements which have been studied thus far, include inorganic semiconductors such as GaAs which have the advantages of being small in size, require little consumption of electric power, etc., are currently being used as display devices having a small surface area, light emitting diode (LED) lamps, semiconductor lasers, and the like. However, in manufacturing such elements, extremely clean processing is required, and it is difficult to make LEDs of large surface area and it is difficult to obtain blue light having good efficiency. Furthermore, there are inorganic semiconductors having fluorescent ions of metal compounds added thereto, and inorganic EL elements made by dispersing inorganic semiconductors into high molecule compounds, but these cause problems in semiconductor stability not only because they require a high operating voltage but also because they operate under high electric fields.

However, as organic EL materials (Appl. Phys. Lett., 51, p.913 (1987)) and macromolecular EL materials (Nature, 347, p.539 (1990)) capable of overcoming such problems are recently being developed, advances in research in this field are continuing to progress. When voltage is applied to an EL element manufactured by depositing organic dyes (Japanese unexamined (laid-open) patent publications 6-136360 and 7-26254), or by putting macromolecules having a conjugate double bond (Int'l patents WO92/03491 and WO93/14177) between an anode and a cathode, holes from the cathode and electrons from the anode are introduced, move to a luminescent layer and emit light when they recombine thereafter. Currently, efforts are being made to find applications of such EL elements for next generation flat panel color display devices, electrochemical cells, image sensors, photocouplers, and the like which use LEDs, which will replace cathode-ray tubes, gas plasma displays, liquid crystal displays used at present. Elements manufactured by deposition of organic dyes have problems in reproducibility and in making uniform films, and macromolecule-based elements have overcome such problems to a certain degree, but improved stability, efficiency and durability are still required for desired applications to practical commercial use. Poly(phenylene vinylene) (PPV), polythiophene (PTh) and polyphenylene-based macromolecules (Synth. Met. 50(1–3), p.491 (1992) and Adv. Mater., 4, p. 36 (1992)), are known as representative macromolecular luminescent materials which have been studied up to now, but these materials have the disadvantage that the final material is insoluble in any organic solvent. The processing suitability is improved by introducing appropriate substituents and PPV or PTh derivatives (Synth. Met., 62, p.35 (1994), Adv. Mater., 4, p.36 (1994), and Macromolecules, 28, p. 7525 (1995)) which emit diverse lights of blue, green and red colors are known but the manufacturing process of such derivatives is very complicated, and there are also problems in stability.

Moreover, fluorene-based macromolecules which emit blue light (Jpn. J. Appl. Phys., 30, p.L1941 (1991)) have been reported but these have disadvantages in that they can not exhibit various other colors, and require the use of materials and manufacturing methods from which macromolecules with more diversified conjugate double bonds can not be made. The inventors of this application discloses a fluorene-based alternating polymer element for an electroluminescence device having a conjugate double bond, which overcome the above-described problems, in Korean Patent No. 16449 on May 16, 1996.

Meanwhile, the phenyl group macromolecular containing an acetylene group is disclosed in Makromol Chem. 191, p. 857 (1990), Macromoleculars, 27, p 562 (1994), J. Chem. Soc., Chem. Commun., p 1433, (1995) and Macromolecules, 29, p 5157 (1996), which are related concerning a non-linear optical material, an optical conductivity, and a photoluminescence (hereinafter, called PL).

DETAILED DESCRIPTION OF THE INVENTION

Figure 1:
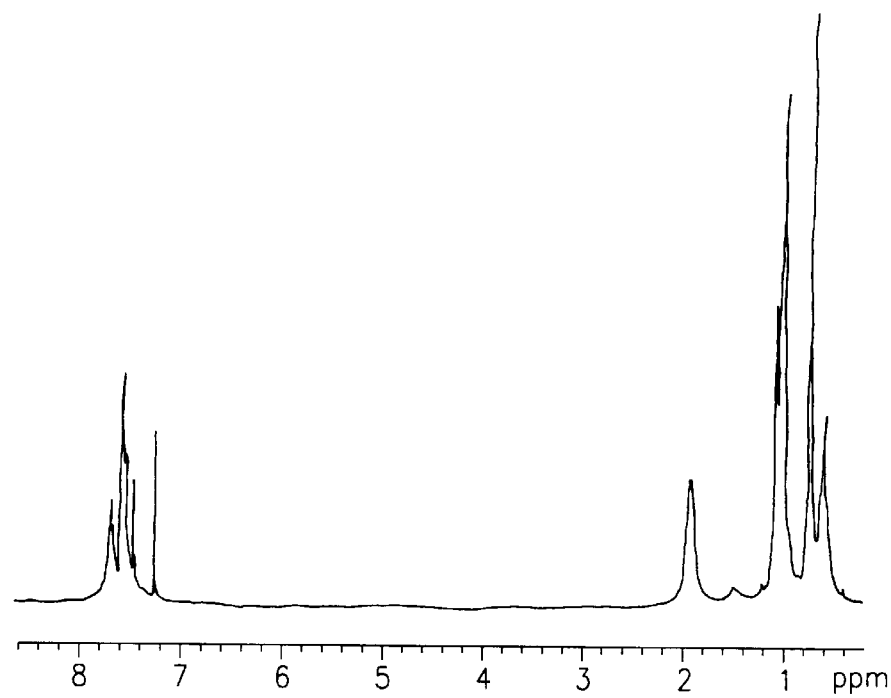
FIG. 1 shows $^1$H-NMR spectrum of a polymer according to Example 5 of the present invention.

The present inventors have created the present invention as a result of their research for manufacturing diverse kinds of macromolecular EL materials which require only a simple manufacturing method, whereby the structure of the final substance is distinct, and being well soluble in any organic solvent.

Namely, the present invention is directed to using a fluorene-based alternating polymer containing an acetylene group as shown in the following Formula (I) which is used when fabricating a macromolecular group EL device. In the alternating polymer according to the present invention, a bridge reaction easily occurs by heat or light, so that it is possible to obtain a thermally stable compound, thus emitting light of a wider region.

For manufacturing the macromolecular EL elements according to the present invention, fluorene-based alternating polymers having the following formula (I) is provided for use as a light emitting material:

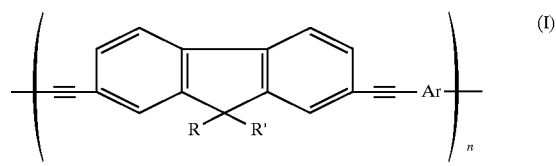

wherein R and R' which may be identical or different, represent hydrogen; aliphatic or alicyclic alkyl or alkoxy groups containing 1 to 22 carbon atoms, or aryl or aryloxy group containing 6 to 18 carbon atoms such as methyl, ethyl, propyl, isopropyl, butyl, isobutyl, pentyl, hexyl, ethylhexyl, heptyl, octyl, isooctyl, nonyl, decyl, dodecyl, hexadecyl, octadecyl, docodecyl, cyclopropyl, cyclopentyl, cyclohexyl, methoxy, ethoxy, butoxy, hexyloxy, methoxyethoxyethyl, methoxyethoxyethoxyethyl, phenyl, phenoxy, tolyl, benzyl, naphthyl and anthracene groups; alkyl or aryl derivatives of silicon, tin or germanium such as trimethylsilyl, triphenylsilyl, tributyltin, or triethylgermanium;

Ar represents phenyl which may be unsubstituted or substituted with aliphatic or alicyclic alkyl or alkoxy having 1 to 22 carbons; diphenyl, diphenylether, diphenylsulfide, diphenylamine, fluorene, terphenyl, naphthalene, anthracene, phenanthrene; heterocyclic compound such as pyridine, furan, thiophene, alkylthiophene, dithiophene, pyrrole, dipyrrole, dipyrrolemethane, dibenzofuran, dibenzothiophene, diphenyloxadiazole, diphenylthiadiazole, carbazole, diphenylmethane, diphenylsilane, bisformylphenoxyalkane and isomers or derivatives thereof;

n denotes an integer greater than or equal to 1.

For reference, the said Ar groups can be illustrated as follows:

—Ar—=

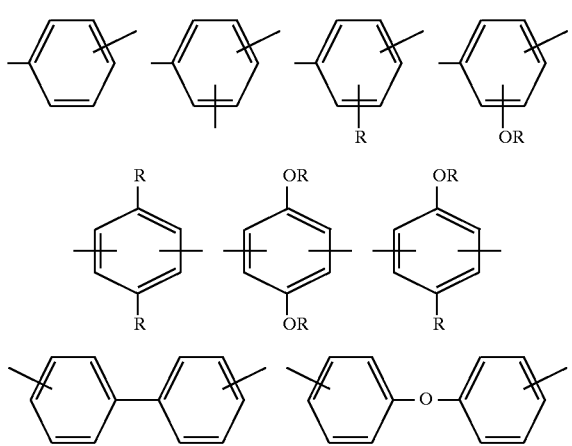

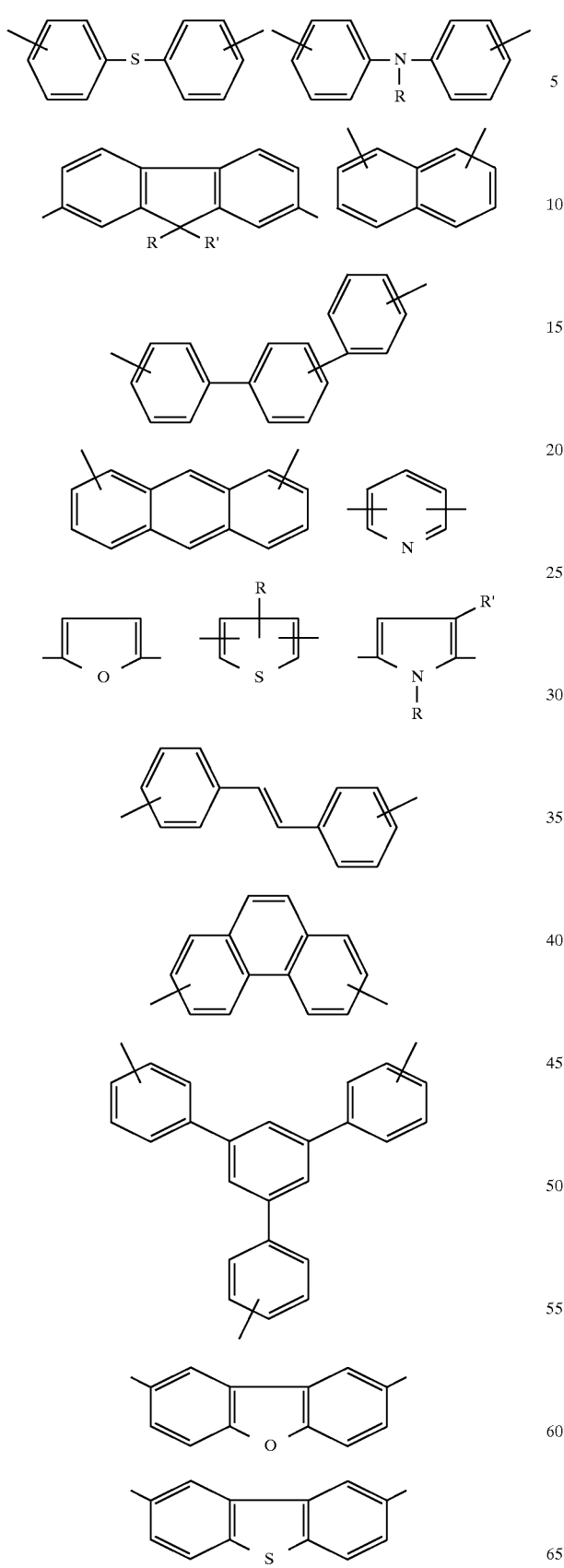
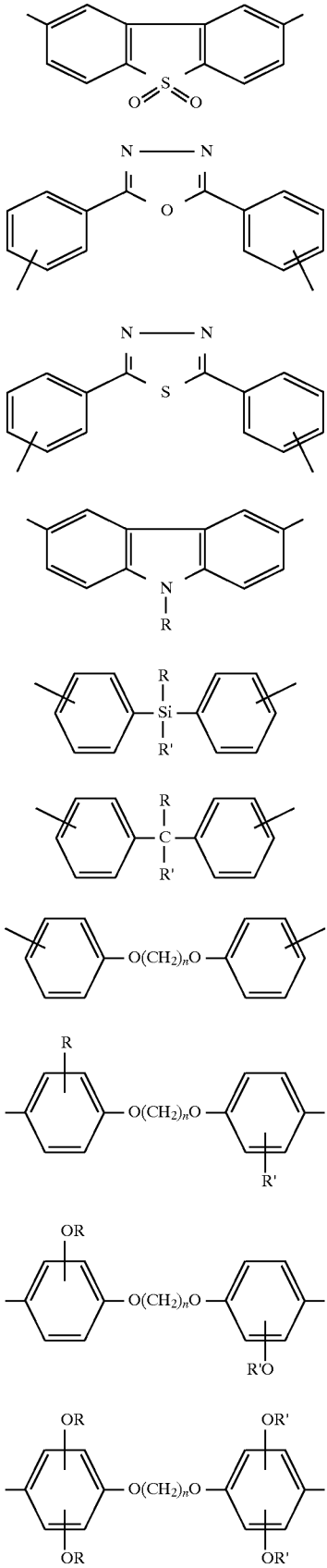

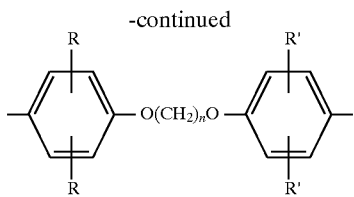

The polymerization degree and the manufacturing method of the polymers used in the present invention need not be particularly restricted. For instance, since such polymers are soluble in any organic solvent, the polymerization degree is generally 1 to 2,000, and preferably 3 to 1,000, to the extent that a film is formed by a spin coating or casting method. As a method for preparing the polymer having triple bonds as represented by Formula (I), it can be mentioned a reaction method between an acetylene compound and a halogen compound as a coupling reaction method using a palladium catalyst, which is a well known method, (J. Polym. Sci., Polym. Chem. Ed., 24, p 2311, (1986), J. Chem. Soc., Chem. Commun., p 1433 (1995) as illustrated in the following reaction scheme (i) and a reaction method between a tin-substituted acetylene compound and a halogen compound (Naturforch., Teil B 37, p 1524 (1982), and J. Chem. Soc., chem. Commun., p. 532 (1989) as illustrated in the following reaction scheme (ii).

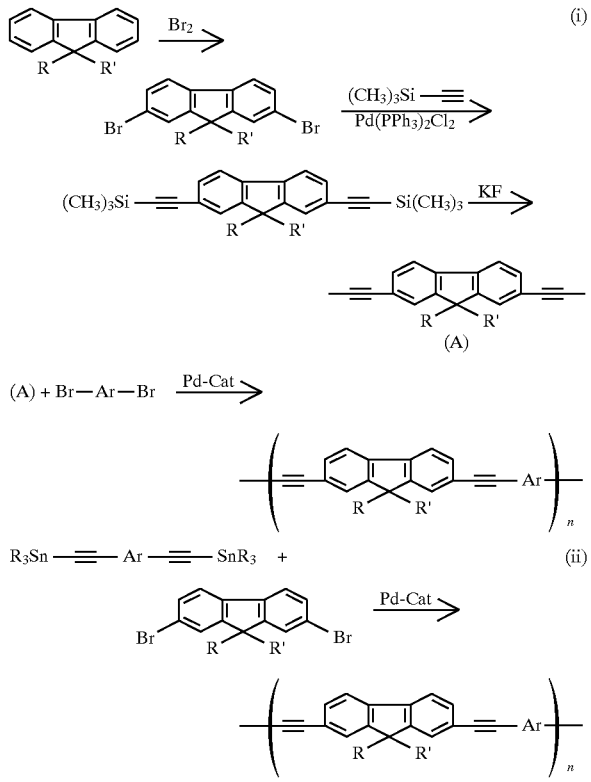

In more detail, in preparing the polymer according to the reaction scheme (i) by a reaction between the acetylene compound and the halogen compound, $Pd(PPh_3)_4$ or $Pd(PPh_3)_2Cl_2$, etc. are used as a palladium catalytic agent and amine compound such as triethylamine, triiopropylamine, or piperidine as a base are employed with a small amount of CuI. The reaction is performed in toluene, THF or DMF solvent. In the present invention, diethynyl fluorene or a derivative thereof is used as the acetylene compound, and aryl compound substitued with two or more halogen such as chlorine, bromine or iodine may be used as the aforementioned halogen compound. Any diethynyl fluorene compound and aryl compound substituted with halogens which can form the polymer of formula (I) may be employed in the present invention. In more detail, as the diethynyl fluorene compound, it can be mentioned such as 2,7-diethynyl fluorene, 2,7-diethynyl-9-alkyl(alkoxy or aryl) fluorene, 2,7-diethynyl-9,9'-dialkyl(alkoxy or aryl) fluorene compound, etc. In addition, as aryl compound substituted with two or more halogens, it can be mentioned 1,4-diiodobenzene, 1,3-dibromobenzene, 1,3,5-tribromobenzene, 1,3,5-tris(para-bromophenyl)benzene 1,4-dialkyl (alkoxy or aryl)-2,5-dibromobenzene, 2,2'-, or 3,3'- or 4,4'-dibromo diphenyl, bis(2- or 3- or 4-bromophenyl) ether or sulfide, or alkylamine, 2,7-dibromo fluorene derivative, a dibromo ortho-, or meta-, or para-terphenyl compound, a phenanthrene compound such as 1,6- or 3,6-dibromophenanthrene, a stilbene compound such as 2,4'- or 4,4'-dibromostilbene, a naphthalene compound such as 1,8- or 2,6-dibromo naphthalene, an anthracene compound such as 1,8- or 3,6- or 9,10-dibromo anthracene, 2,6-dibromopyridine, 2,5-dibromofuran, 2,5-dibromothiophene, 5,5'-dibromo-2,2'-dithiophene, 5,5-dibromo-2,2'-dithiophene, 3-alkyl-2,5-dibromothiophene, N-alkyl-2,5-dibromopyrrole, 2,8-dibromo-dibenzofuran, 2,8-dibromo-dibenzothiophene, 2,8-dibromo-dibenzothiophene-5,5-dioxide, 2,5-bis(2- or 3- or 4-bromophenyl)-1,3,4-oxadiazole, 2,5-bis(2- or 3- or 4-bromophenyl)-1,3,4-diphenylthiadiazole, and N-alkyl-3,6-dibromocarbazole.

As the acetylene compounds substitued with tin as used in the reaction scheme (ii), it can be mentioned such as bis(tributylstannyl) acetylene, bis(tributylstannyl)-1,4-diethynyl benzene. As the halogen compound, the same compound as mentioned in connection with the reaction scheme (i) can be directly used. Polymerization is carried out by condensing these two compounds in the presence of the aforementioned palladium catalyst in an organic solvent such as dimethylacetamide, dimethyformamide, tetrahydrofuran, or toluene.

In the construction of an EL device used a macromolecular by heating a fluorene group macromolecular and scanning ultraviolet ray thereto, the compound which is a luminescence layer is disposed between an anode and a cathode. Namely, the most general device construction of the anode/luminescence layer/cathode may be included therein. For example, as is well disclosed in Japanese Patent Publication Nos. 2-135361, 152184 and 6-207170, the construction of the anode/hole transfer layer/luminescence layer/electron transfer layer/cathode which uses a hole transfer layer or an electron transfer layer may be used. Namely, the construction thereof is not limited. In the construction of the anode, a transparent support substrate such as glass, transparent plastic, quartz, etc. is coated with a metallic or metallic oxide such as ITO, Au, copper, oxide tin, or oxidezinc or an organic semiconductor compound such as a polypyrrole, polyaniline or polythiophene to a thickness of 10 nanometer~1 micron. In addition, as the cathode, a metallic such as natrum, magnesium, calcium, aluminum, indium, silver, gold, or copper or an alloy thereof may be used. In more detail, as the hole transfer layer, a polyvinylcarbazole, 2,5-bis-(4'-diethylaminophenyl)-1,3,4-oxadizole, and N,N'-diphenyl-N,N'-(3-methylphenyl)-1,1'-biphenyl-4,4'-diamine (TPD), and as the electron transfer layer, tris(8-hydroxyquinolinato) aluminum, 2-(4'-tert-butylphenyl)5-(4''-bi-phenyl)-1,3,4-oxadiazole, 2,4,7-trinitro-9-fluorenone are coated by using a known thin film formation method such as a vacuum deposition method, a spin coating method, a spin coating method, a casting method and LB method.

In addition, the luminescence polymer according to the present invention may be blended with the hole transfer hole or another polymer and the electron transfer layer or the existing luminescence polymer such as a soluble PPV or PTh derivative. For example, polyvinylcarbazole or poly(1, 4-hexyloxy-2,5-phenylenvinylene) or poly(3-hexylthiophene) and the fluorene group macromolecular is processed in an organic solvent such as chloroform, and then the resultant material is coated in the spin coating method or the casting method. The density is not limited thereto, but more preferably the density of the fluorene is 0.001~99 weight % with respect to the polyvinylcarbazole, and more preferably the same is 0.1~50 weight %. The thickness of the thin film is 5 nanometer~5 nanometer, and more preferably the same is 50 nanometer~1 micron. In addition, another macromolecular which is soluble in known organic solvent may be blended for the same purpose in the above described range of density and thickness. For example, as the usable macromolecular, there are known polymethylmethacrylate, polyarcylate, polystyrene, polycarbonate, polyvinylchloride, polyethylene, polypropylene, polyacrylonitrile, polyvinylpyrrolidone, polyvinylalcohol, polyvinylacetate, polyvinylbutyral, polyvinylamine, polycaprolacton, polyethylentherephthalate, polybutylentherephthalate, polyurethan, ABS, polysulfone, polyvinylfluoride, etc., or resins for general use, such as acetal, polyamides, polyimides, polyester, alkyd, urea, furan, nylon, melamine, phenol, silicon, epoxy, etc. may be used therefor.

The present invention is hereinafter described in details by examples which are not limitative.

EXAMPLE

Synthesis of Monomers

Monomers to be used in the present invention are not required to be particularly restricted. For example, any monomer will do as long as the polymer formed after polymerization is a macromolecule satisfying the formula (I). Even though it is not specifically mentioned in the following descriptions, compounds that can be easily synthesized in general, that are already well known or which are similar, or monomers that are commercially available were synthesized employing already known or similar methods, or purchased for manufacturing the polymers of the present invention.

Synthesis of 2,7-dibromo-9,9'-di-n-hexylfluorene

In a 1 L three-neck flask equipped with a stirrer, a thermometer and a reflux condenser, 66.8 g (0.2 mol) of 9,9'-di-n-hexylfluorene and 500 ml of methylene chloride were introduced and cooled down to 5° C. temperature by using ice, and 67.2 g (0.42 mol) diluted by the methylene chloride of 150 ml was dropped down slowly thereinto. The dropping thereof was completed, the resultant solution was reacted for 24 hours at 25° C. Thereafter, 20% of potassium hydroxide aqueous solution was slowly supplied thereto, thus separating organic layer, and the resultant material was rinsed several times, and then was dried by anhydrous magnesium sulfate. Next, the resultant material was filtered, thus obtaining viscous liquid. The viscous liquid was mixed with 300 ml of hexane and was cooled down to −40° C., thus producing a solid. The solid was recrystallized by hexane two times, thus obtaining white crystal. The crystal was filtered and was dried in a vacuum oven at a temperature of 30° C., thus obtaining 89 g (90% yield) of the white solid. The melting point was 61°–62° C. [$^1$H-NMR (CDCl$_3$), δ 0.58 (br, s, CH$_3$), 0.74–1.04 (m, 16H, CH$_2$), 1.87–1.95 (m, 4H, CCH$_2$), 7.42–7.49 (m, 6H, aromatic).

Synthesis of 2,7-bis[(trimethylsilyl) ethynyl]-9,9'-di-n-hexyl fluorene

In a 1 L three-neck flask equipped with a stirrer, a thermometer and a reflux condenser, 49.2 g (0.1 mol) of 2,7-dibromo-9,9'-di-n-hexylfluorene, 3.95 g (5 mm mol) of bis(triphenylphosphine) palladium dichloride [(PPh$_3$)$_2$PdCl$_2$], and 0.95 g (5 mm mol) of copper iodide were mixed with 400 ml of piperidine, and 21.6 g (0.22 mol) of trimethylsilyl acetylene was slowly dropped at room temperature. When the dropping of the same was finished, the reaction temperature was slowly increased and the circulation was performed therein for three hours. When the reaction was finished, the solvent was removed under vacuum condition, and then was extracted three times with benzene and then was washed by water several times, and the resultant material was dried by using anhydrous magnesium sulfate, and then was decolored using active carbon. Thereafter, the resultant material was filtered, thus removing solvent and obtaining a milky solid material. The thusly obtained material was re-crystallized twice using ethanol, thus obtaining a pure crystal. The thusly obtained crystal was fully dehydrated in the vacuum oven at a temperature of 30° C. The crystal was weighed 42 g with a yield of 80%, and the melting temperature was 126°–128° C. $^1$H-NMR (CDCl$_3$), δ 0.28 (s, 18H, SiCH$_3$), 0.52 (br, s 6H, CH$_3$), 0.73–1.12 (m, 16H, CH$_2$), 1.89–1.97 (m 4H, CCH$_2$), 7.42–7.61 (m, 6H, aromatic group). IR (KBr): 2156 (C≡C), 852 (SiCH$_3$).

Synthesis of 2,7-diethynyl-9,9'-di-n-hexyl fluorene 2,7-bis[(trimethylsilyl)ethynyl]-9,9'-di-n-hexyl fluorene 27.4 g (52 mmol) and potassium fluoride 4.53 g (78 mmol) were melted into 5 ml of water and 150 ml of dimethyl formamide in a 250 ml plask equipped with a mixer and a thermometer, and the resultant mixture was reacted at room temperature for 6 hours. When the reaction was finished, the reaction solution was poured into 500 ml of ice water, and then the resultant material was extracted three time with ethyl ether, and the thusly extracted solution was dried over magnesium sulfate. After filtering, the solvent was removed by evaporation to obtain a viscous liquid, which was then refined using silica gel column (ethyacetate/hexane=1/10 of solvent mixture), and was re-crystallized with ethanol. Thereafter, a soft yellow solid material of 17.1 gram (86%) was obtained, and the melting point thereof was 36°–37° C. $^1$H-NMR(CDCl$_3$), δ 0.58 (br, 6H, CH$_3$), 0.76–1.13 (m, 16H, CH$_2$), 1.93–1.96 (m, 4H, CCH$_2$), 3.14 (s, 2H, CH), 7.46–7.65 (m, 6H, aromatic group), $^{13}$C-NMR (CDCl$_3$), δ 13.90 (CH$_3$), 22.34, 23.68, 29.62, 31.47, 40.22 (CH$_2$), 55.23 (quaternary), 77.28 (≡CH), 84.54 (C≡), 119.95, 120.92, 126.58, 131.26, 141.01, 151.09 (aromatic group)., IR (KBr): 3296 (≡CH).

[Synthesis of Polymers]

Example 1

Synthesis of poly(9,9'-di-n-hexyl-2,7-fluorenediylethynylene-alt-1,4-phenyleneethynylene)

Under nitrogen atmosphere, 2,7-diethynyl-9,9'-di-n-hexyl fluorene 0.76 g (2 mmol), 1,4-diiodobenzene 0.59 g (1.8 mmol), iodobenzene 81.6 mg (0.4 mmol), tetrakistriphenylphosphine palladium [(PPh$_3$)$_4$Pd] 92.4 mg (0.08 mmol), and cuprous iodide 15.2 mg (0.08 mmol) were dissolved in a mixture of 50 ml of toluene and 20 ml of diisopropylamine in 100 ml plask equipped with a stirrer and then polymerized at 70° C. for 2 hours. Thereafter, 0.2 g (1.0 mmol) of iodobenzene was mixed with the resultant material and then was reacted further for 2 hours. The reaction temperature was lowered to a room temperature, and a reaction mixture was dropped into 1 liter of methanol to precipitate polymer. The precipitated solid was filtered, and dissolved in chloroform, and was precipitated again with methanol to obtain purified solid, The resultant solid was washed with methanol, and dried sufficiently in a vacuum oven at 40° C. As a result, 0.91 g of the title polymer as a yellow solid was obtained. The weight average molecular weight and molecular weight distribution of such polymer was obtained by using polystyrene reference substance in the presence of tetrahydrofuran, and the result was 563,400 and 8.84, respectively. $^1$H-NMR (CDCl$_3$), δ 0.5–1.2 (br, m, CH$_3$ and CH$_2$), 1.9–2.1 (br, m, CCH$_2$) 7.4–7.7 (br, m, aromatic).

Example 2

Synthesis of poly(9,9'-di-n-hexyl-2,7-fluorenediylethynylene-alt-1,4-phenyleneethynylene)

Example 2 was performed in the same manner as was in example 1 except that 0.42 g (1.8 mmol) of 1,4-dibromobenzene was used instead of 1,4-diiodobenzene, and 62.8 mg (0.4 mmol) of bromobezene was used instead of iodobenzene. The polymerization was performed identically to example 1, thus obtaining 0.90 g of a yellow solid material. The mass average molecular weight and molecular weight distribution of the polymer measured with GPC using a polystyrene reference material in tetrahydrofuran solvent were 101,300 and 7.56, respectively. $^1$H-NMR (CDCl$_3$), δ 0.5–1.2 (br, m, CH$_3$ and CH$_2$), 1.9–2.1 (br, m, CCH$_2$), 7.4–7.7 (br, m, aromatic).

Example 3

Synthesis of poly(9,9'-di-n-hexyl-2,7-fluorenediylethynylene-alt-4,4-biphenyleneethynylene)

Example 3 was performed in the same manner as was in example 1 except that 0.73 g (1.8 mmol) of 4,4'-diiodobiphenyl was used instead of 1,4-diiodobenzene to obtain 1.0 g of orange colored solid. The mass average molecular weight and molecular weight distribution of the thusly obtained polymer measured based with GPC using a polystyrene reference material in a tetrahydrofuran solution were 99,600 and 3.69, respectively. $^1$H-NMR (CDCl$_3$), δ 0.5–1.2 (br, m, CH$_3$ and CH$_2$), 1.9–2.1 (br, m, CCH$_2$), 7.3–7.7 (br, m, aromatic).

Example 4

Synthesis of poly(9,9'-di-n-hexyl-2,7-fluorenediylethynylene-alt-4,4'-biphenyleneethynylene)

Example 4 was performed in the same manner as was in example 1 except that 0.56 g (1.8 mmol) of 4,4'-diboromobiphenyl and 62.8 mg (0.4 mmol) of bromobenzene were used instead of 1,4-diiodobenzene and iodobenzene, respectively, to obtain 0.99 g of orange colored solid. The mass average molecular weight and molecular weight distribution of the thus obtained polymer measured with GPC using polystyrene reference material in tetrahydrofuran solvent were 98,700 and 6.65, respectively. $^1$H-NMR (CDCl$_3$), δ 0.5–1.2 (br, m, CH$_3$ and CH$_2$), 1.9–2.1 (br, m, CCH$_2$), 7.3–7.7 (br, m, aromatic).

Example 5

Synthesis of poly(9,9'-di-n-hexyl-2,7-fluoreneethynylene)

Polymerization was performed as was in example 1 except that 0.89 g (1.8 mmol) of 2,7-dibromo-9,9'-di-n-hexyl fluorene was used instead of 1,4-diiodobenzene, and 62.8 mg (0.4 mmol) of bromobenzene was used instead of iodobenzene, to obtain a yellow solid material of 1.42 g. The mass average molecular weight and molecular weight distribution of the obtained polymer measured with GPC using a polystyrene reference material in the tetrahydrofuran solvent were 16,800 and 2.97, respectively. $^1$H-NMR (CDCl$_3$), δ 0.5–1.2 (br, m, CH$_3$ and CH$_2$), 1.9–2.1 (br, m, CCH$_2$), 7.3–7.7 (br, m, aromatic).

Example 6

Synthesis of poly(9,9'-di-n-hexyl-2,7-fluorenediylethynylene-alt-1,3-phenyleneethynylene)

Polymerization was performed as was in example 2 except that 1,3-dibromobenzene was used instead of 1,4-dibromobenzene, to obtain yellow solid material of 0.91 g. The mass average molecular weight and molecular weight distribution of the obtained polymer measured with GPC using a polystyrene reference material in the tetrahydrofuran solution were 12,300 and 2.85, respectively. $^1$H-NMR (CDCl$_3$), δ 0.5–1.2 (br, m, CH$_3$ and CH$_2$), 1.9–2.1 (br, m, CCH$_2$) 7.3–7.7 (br, m, aromatic).

Example 7

Synthesis of poly(9,9'-di-n-hexyl-2,7-fluorenediylethynylene-alt-9,9'-ditrimethylsilyl-2,7-fluoreneethynylene)

Polymerization was performed as was in example 2 except that 0.84 g of 2,7-dibromo-9,9'-ditrimethylsilyl fluorene was used instead of 1,4-dibromobenzene, to obtain yellow solid material of 1.32 g. The mass average molecular weight and molecular weight distribution of the obtained polymer measured with GPC using a polystyrene reference material in the tetrahydrofuran solvent were 14,500 and 3.10, respectively. $^1$H-NMR (CDCl$_3$), δ 0.0 (s, SiCH$_3$), 0.5–1.2 (br, m, CCH$_2$ and CH$_2$), 1.9–2.1 (br, m, CCH$_2$), 7.4–8.0 (br, m, aromatic).

Example 8

Synthesis of poly(9,9'-di-n-hexyl-2,7-fluorenediylethynylene-alt-1,4-bis(hexyloxy)-2,5-phenyleneethynylene)

Polymerization was performed as was in example 2 except that 0.78 g of 1,4-bis(hexyloxy)-2,5-dibromobenzene was used instead of 1,4-dibromobenzene, to obtain yellow solid material of 1.30 g. The mass average molecular weight and molecular weight distribution of the obtained polymer measured with GPC using a polystyrene reference material in the tetrahydrofuran solvent were 48,200 and 4.29, respectively. $^1$H-NMR (CDCl$_3$), δ 0.5–1.7 (br, m, CH$_3$ and CH$_2$), 1.9–2.1 (br, m, CCH$_2$), 4.0–4.2 (br, m, OCH$_2$), 7.1–7.8 (br, m, aromatic).

Example 9

Synthesis of poly(9,9'-di-n-hexyl-2,7-fluorenediylethynylene-alt-9,10-anthraceneethynylene)

Polymerization was performed as was in example 2 except that 0.60 g of 9,10-dibromoanthracene was used instead of 1,4-dibromobenzene, to obtain red colored solid material of 1.11 g. The mass average molecular weight and molecular weight distribution of the obtained polymer measured with GPC using a polystyrene reference material in the tetrahydrofuran solvent were 56,400 and 5.81, respectively. $^1$H-NMR (CDCl$_3$), δ 0.5–1.2 (br, m, CH$_3$), 1.9–2.2 (br, m, CCH$_2$), 7.5–7.9 (br, m, fluorene-aromatic group), 8.6–8.9 (br, m, anthracene).

Example 10

Synthesis of poly(9,9'-di-n-hexyl-2,7-fluorenediylethynylene-alt-4,4'-diphenyletherethynylene)

Polymerization was performed as was in example 2 except that 0.59 g of 4,4'-dibromodiphenylether was used instead of 1,4-dibromobenzene, to obtain yellow solid material of 1.05 g. The mass average molecular weight and molecular weight distribution of the obtained polymer measured with GPC using a polystyrene reference material in the tetrahydrofuran solvent were 49,600 and 7.38, respectively. $^1$H-NMR (CDCl$_3$), δ 0.5–1.2 (br, m, CH$_3$ and CH$_2$), 1.9–2.1 (br, m, CCH$_2$), 6.9–7.7 (br, m, thiophene ring and fluorene ring).

Example 11

Synthesis of poly(9,9'-di-n-hexyl-2,7-fluorenediylethynylene-alt-1-bromo-3,5-phenyleneethynylene)

Polymerization was performed as was in example 2 except that 0.56 g of 1,3,5-tribromobenzene was used instead of 1,4-dibromobenzene, to obtain yellow solid material. The mass average molecular weight and molecular weight distribution of the obtained polymer measured with GPC using a polystyrene reference material in the tetrahydrofuran solvent were 26,200 and 4.06, respectively. $^1$H-NMR (CDCl$_3$), δ 0.5–1.2 (br, m, CH$_3$ and CH$_2$), 1.9–2.1 (br, m, CCH$_2$), 7.3–7.7 (br, m, aromatic).

Example 12

Synthesis of poly(9,9'-di-n-hexyl-2,7-fluorenendiylethynylene-alt-2,5-thiopheneethynylene)

Polymerization was performed as was in example 2 except that 0.43 g of 2,5-di-bromothiophene was used instead of 1,4-dibromobenzene, to obtain yellow solid material of 0.92 g. The mass average molecular weight and molecular weight distribution of the obtained polymer measured with GPC using a polystyrene reference material in the tetrahydrofuran solvent were 51,300 and 3.90, respectively. $^1$H-NMR (CDCl$_3$), δ 0.5–1.2 (br, m, CH$_3$ and CH$_2$), 1.9–2.1 (br, m, CCH$_2$), 7.1–7.7 (br, m, aromatic).

Example 13

Synthesis of poly[tris(9,9'-di-n-hexyl-2,7-fluorenediylethynylene-alt-1,3,5-phenyleneethynylene)]

Polymerization was performed as was in example 11 except that 0.38 g of 1,3,5-tribromobenzene was used, to obtain yellow solid material of 0.38 g. The mass average molecular weight and molecular weight distribution of the obtained polymer measured with GPC using a polystyrene reference material in the tetrahydrofuran solvent were 28,100 and 4.30, respectively. $^1$H-NMR (CDCl$_3$), δ 0.5–1.2 (br, m, CH$_3$ and CH$_2$), 1.9–2.1 (br, m, CCH$_2$), 7.4–7.7 (br, m, aromatic).

Example 14

Synthesis of poly[tris(9,9'-di-n-hexyl-2,7-fluorenediylethynylene-alt-1,3,5-phenyleneethynylene)]

Polymerization was performed as was in example 2 except that 0.65 g of 1,3,5-tris(para-bromophenyl)benzene was used instead of 1,4-dibromobenzene, to obtain yellow solid material of 1.29 g. The mass average molecular weight and molecular weight distribution of the obtained polymer measured with GPC using a polystyrene reference material in the tetrahydrofuran solvent were 29,500 and 4.63, respectively. $^1$H-NMR (CDCl$_3$), δ 0.5–1.2 (br, m, CH$_3$ and CH$_2$), 1.9–2.1 (br, m, CCH$_2$), 7.3–7.8 (br, m, aromatic).

Example 15

Synthesis of poly(9,9'-di-n-hexyl-2,7-fluorenediylethynylene-alt-2,8-dibenzothipheneethynylene)

Polymerization was performed as was in example 2 except that 0.62 g of 2,8-dibromodibenzothiophene was used instead of 1,4-dibromobenzene, to obtain an orange colored solid material of 1.10 g. The mass average molecular weight and molecular weight distribution of the obtained polymer measured with GPC using a polystyrene reference material in the tetrahydrofuran solvent were 119,200 and 8.40, respectively. $^1$H-NMR (CDCl$_3$), δ 0.5–1.2 (br, m, CH$_3$ and CH$_2$), 1.9–2.1 (br, m, CCH$_2$), 7.3–7.8 (br, m, aromatic).

Example 16

Synthesis of poly(9,9'-di-n-hexyl-2,7-fluorenediylethynylene-alt-2,8-dibenzothiophene-5,5-dioxideethynylene)

Polymerization was performed as was in example 2 except that 0.67 g of 2,8-dibromodibenzothiophene-5,5-dioxide was used instead of 1,4-di-bromobenzene, to obtain an orange colored solid material of 1.15 g. The mass average molecular weight and molecular weight distribution of the obtained polymer measured with GPC using a polystyrene reference material in the tetrahydrofuran solvent were 16,500 and 2.43, respectively. $^1$H-NMR (CDCl$_3$), δ 0.5–1.2 (br, m, CH$_3$ and CH$_2$), 1.9–2.1 (br, m, CCH$_2$), 7.4–8.0 (br, m, aromatic).

Example 17

Synthesis of poly(9,9'-di-n-hexyl-2,7-fluorenediylethynylene-alt-2,8-dibenzofuranethynylene)

Polymerization was performed as was in example 2 except that 0.59 g of 2,8-dibromodibenzofuran was used instead of 1,4-dibromobenzene, to obtain an orange colored solid material of 1.0 g. The mass average molecular weight and molecular weight distribution of the obtained polymer measured with GPC using a polystyrene reference material in the tetrahydrofuran solvent were 185,200 and 8.21, respectively. $^1$H-NMR (CDCl$_3$), δ 0.5–1.2 (br, m, CH$_3$ and CH$_2$), 1.9–2.1 (br, m, CCH$_2$), 7.3–7.8 (br, m, aromatic).

Example 18

Synthesis of poly(9,9'-di-n-hexyl-2,7-fluorenediylethynylene-alt-2,5-furanethynylene)

Polymerization was performed as was in example 2 except that 0.41 g of 2.5-dibromofuran was used instead of 1,4-dibromo benzene, to obtain an orange colored solid material of 0.88 g. The mass average molecular weight and molecular weight distribution of the obtained polymer measured with GPC using a polystyrene reference material in the tetrahydrofuran solvent were 11,800 and 2.29, respectively. $^1$H-NMR (CDCl$_3$), δ 0.5–1.2 (br, m, CH$_3$ and CH$_2$), 1.9–2.1 (br, m, CCH$_2$), 7.3–7.7 (br, m, aromatic).

Figure 2:
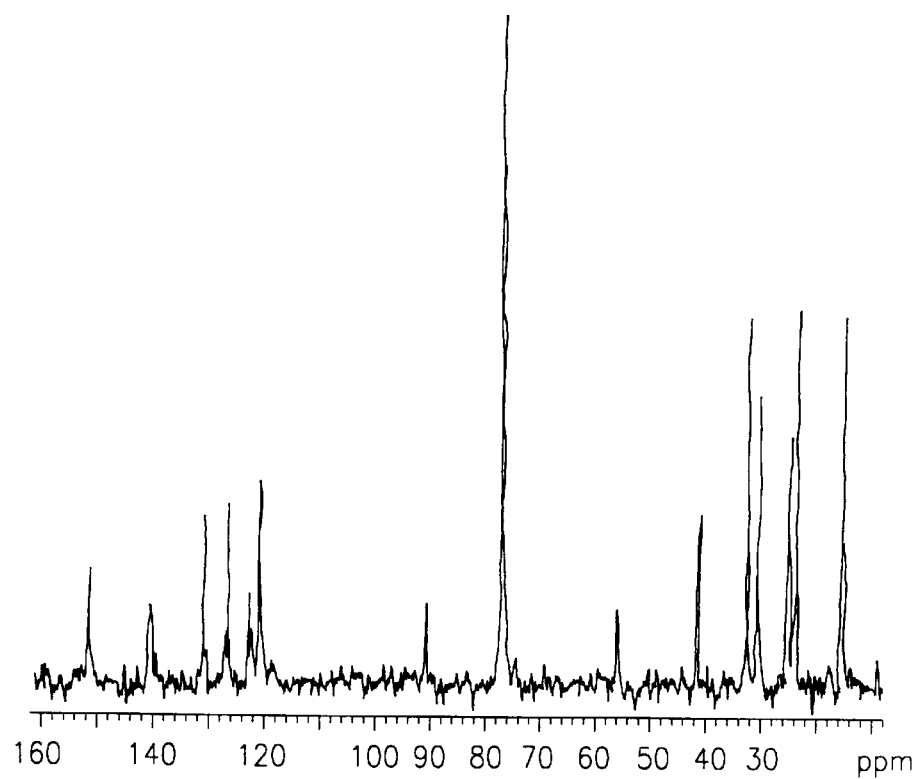
FIG. 2 shows $^{13}$C-NMR spectrum of a polymer according to Example 5 of the present invention.
Figure 3A:
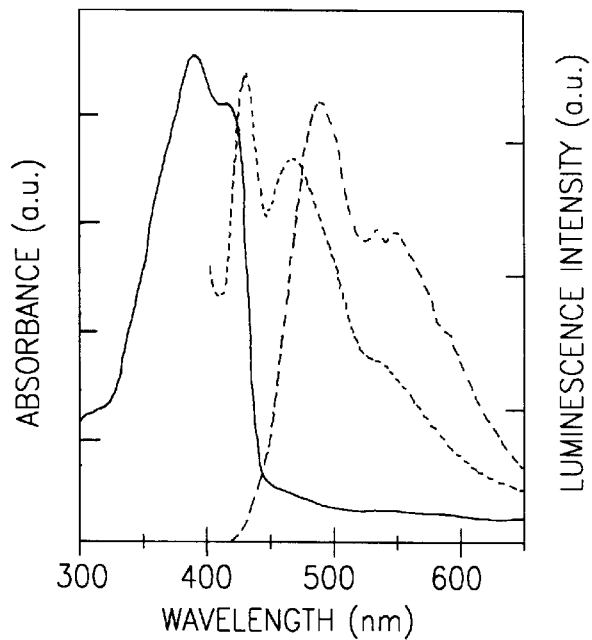
FIG. 3A shows the UV absorption spectrum (———), photoluminescence spectrum (.....), and an EL spectrum (----) of a polymer according to Example 2 of the present invention.
Figure 3B:
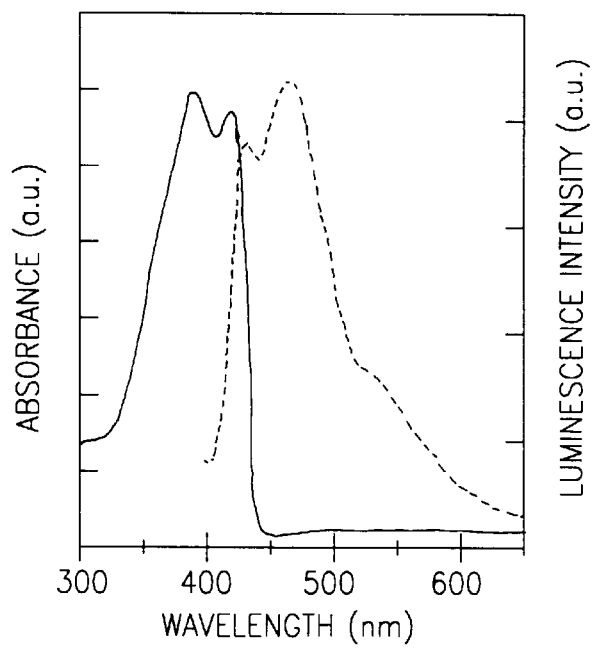
FIG. 3B shows the UV absorption spectrum (———), photoluminescence spectrum (.....), and an EL spectrum (----) of a polymer according to Example 4 of the present invention.
Figure 3C:
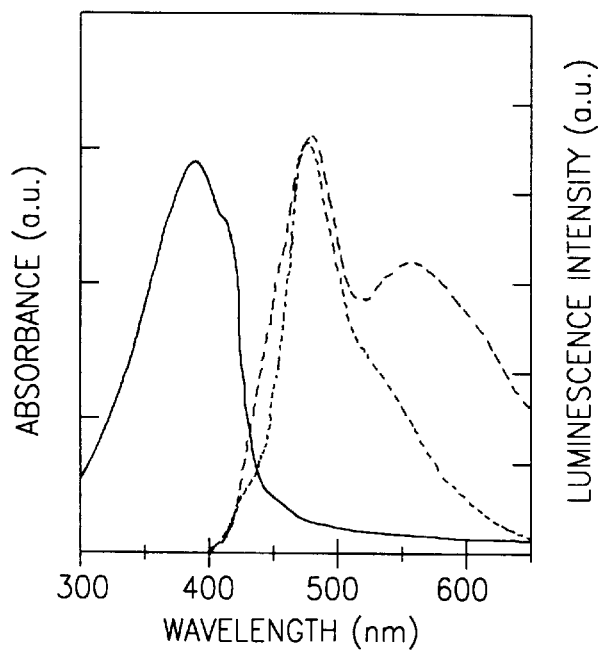
FIG. 3C shows the UV absorption spectrum (———), photoluminescence spectrum (.....), and an EL spectrum (----) of a polymer according to Example 5 of the present invention.
Figure 3D:
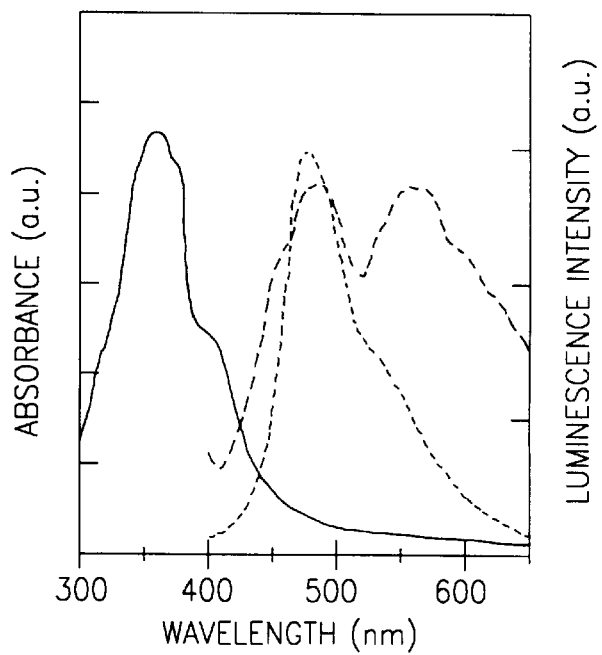
FIG. 3D shows the UV absorption spectrum (———), photoluminescence spectrum (.....), and an EL spectrum (----) of a polymer according to Example 6 of the present invention.
Figure 3E:
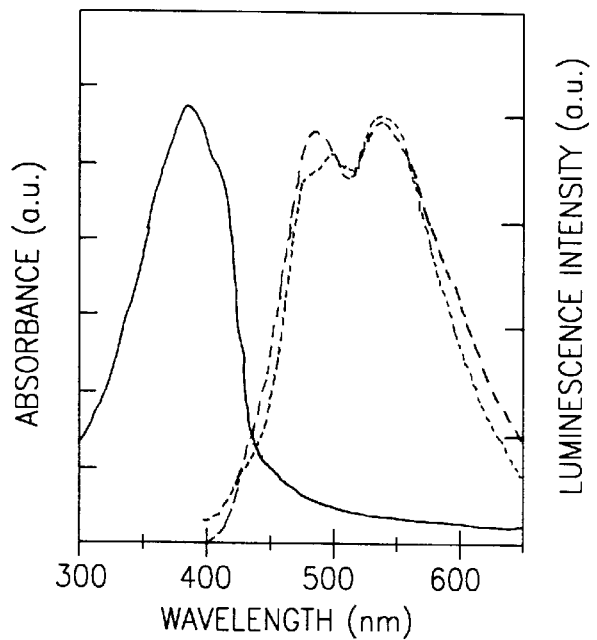
FIG. 3E shows the UV absorption spectrum (———), photoluminescence spectrum (.....), and an EL spectrum (----) of a polymer according to Example 7 of the present invention.
Figure 3F:
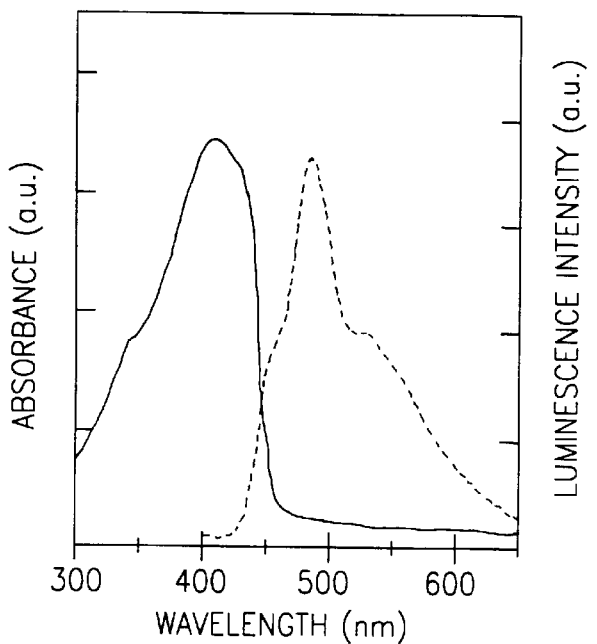
FIG. 3F shows the UV absorption spectrum (———) and photoluminescence spectrum (.....) of a polymer according to Example 8 of the present invention.
Figure 3G:
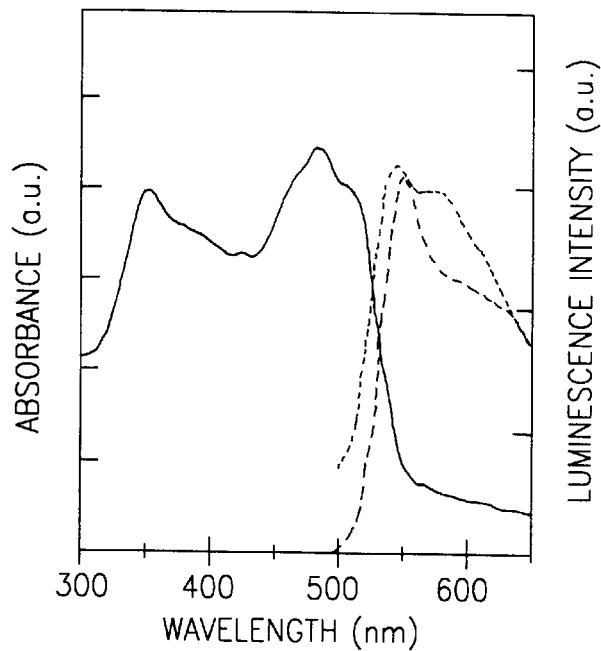
FIG. 3G shows the UV absorption spectrum (———), photoluminescence spectrum (.....), and an EL spectrum (----) of a polymer according to Example 9 of the present invention.
Figure 3H:
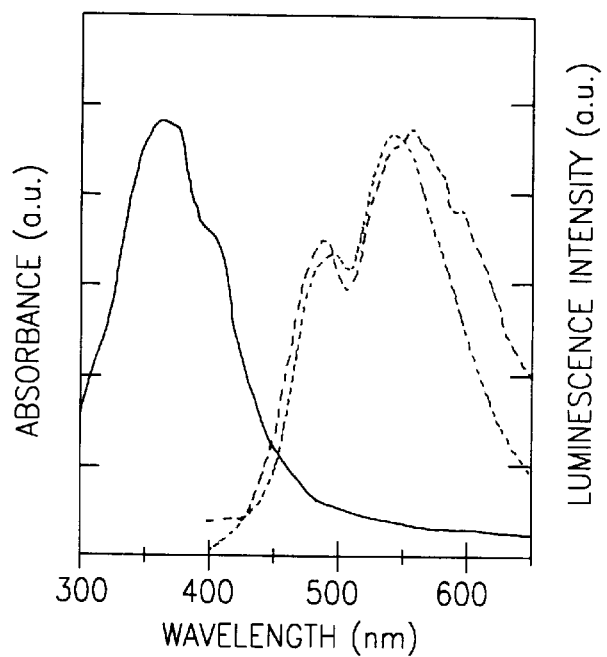
FIG. 3H shows the UV absorption spectrum (———), photoluminescence spectrum (.....), and an EL spectrum (----) of a polymer according to Example 10 of the present invention.
Figure 3I:
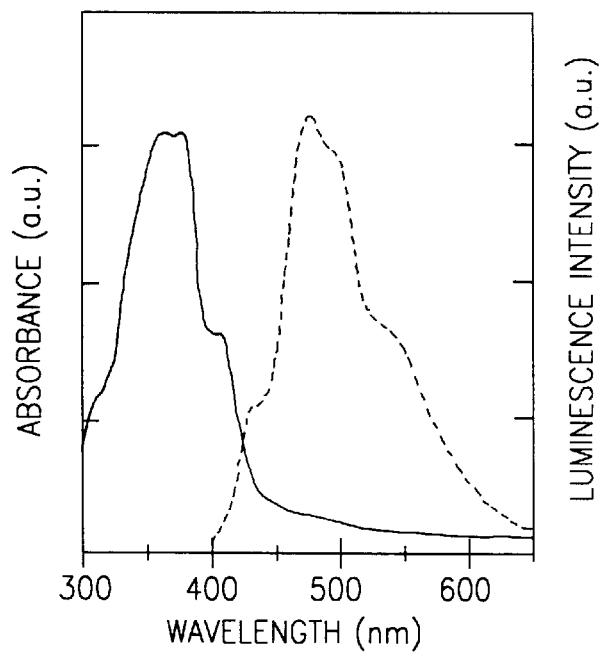
FIG. 3I shows the UV absorption spectrum (———) and photoluminescence spectrum (.....) of a polymer according to Example 11 of the present invention.
Figure 3J:
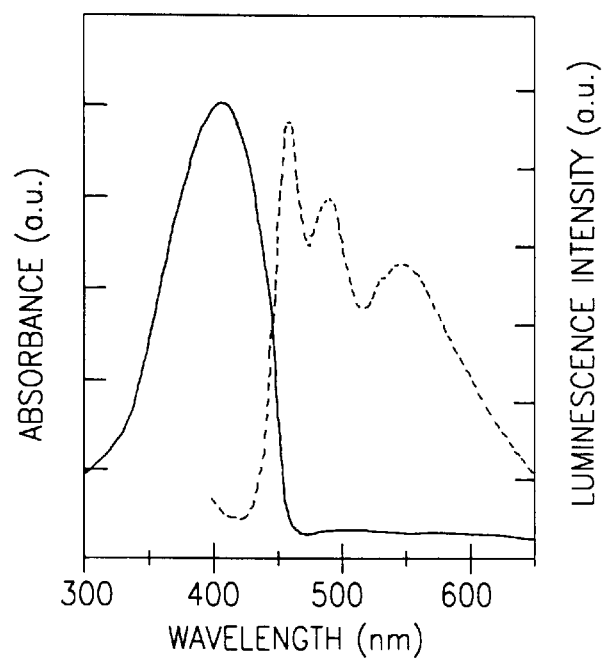
FIG. 3J shows the UV absorption spectrum (———) and photoluminescence spectrum (.....) of a polymer according to Example 12 of the present invention.
Figure 3K:
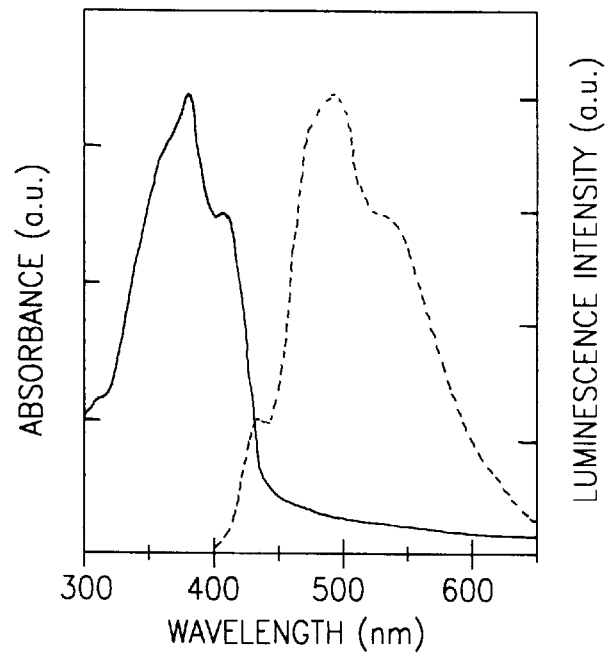
FIG. 3K shows the UV absorption spectrum (———) and photoluminescence spectrum (.....) of a polymer according to Example 14 of the present invention.
Figure 3L:
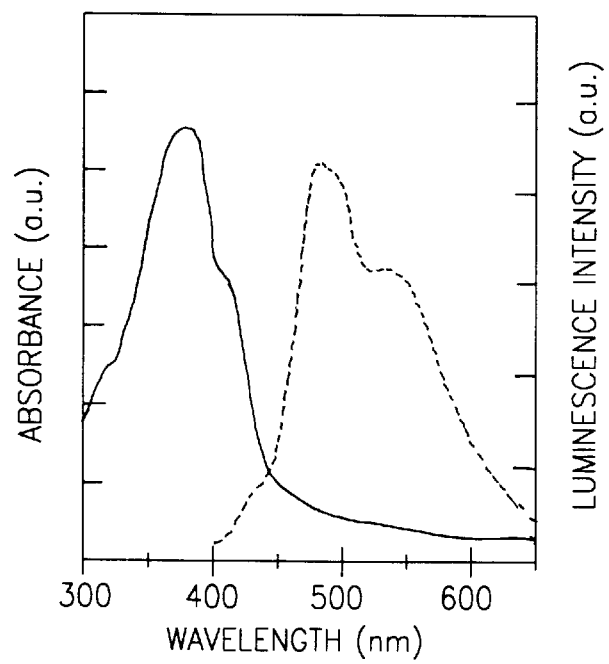
FIG. 3L shows the UV absorption spectrum (———) and photoluminescence spectrum (.....) of a polymer according to Example 15 of the present invention.
Figure 3M:
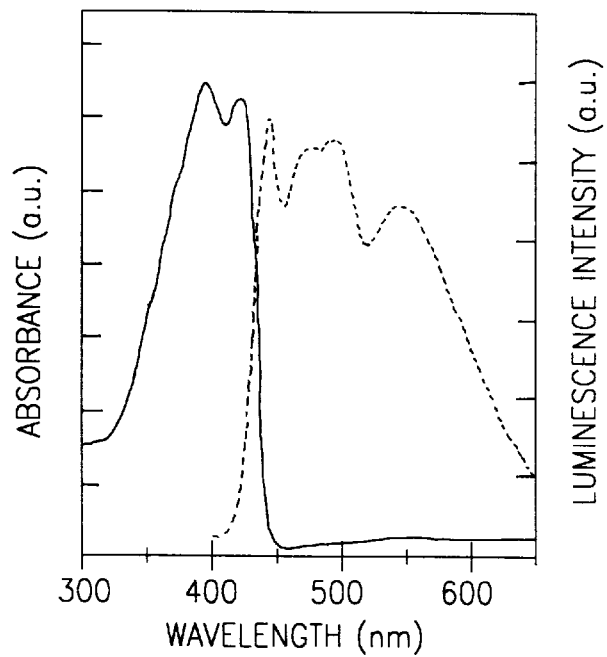
FIG. 3M shows the UV absorption spectrum (———) and photoluminescence spectrum (.....) of a polymer according to Example 16 of the present invention.
Figure 3N:
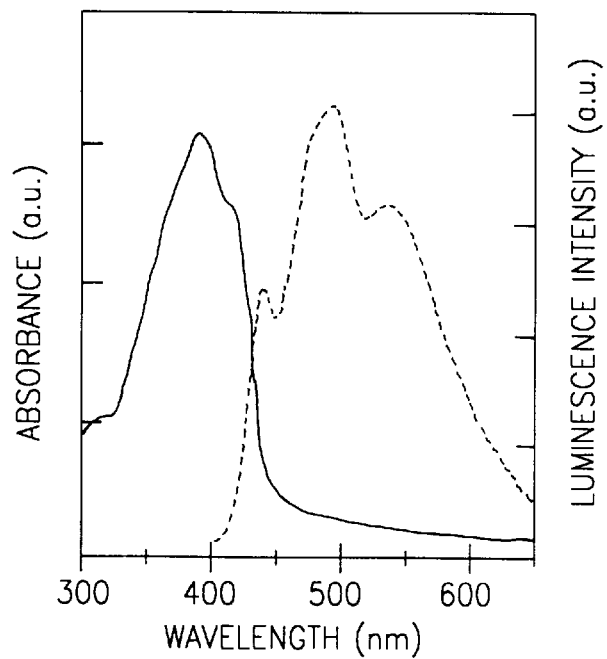
FIG. 3N shows the UV absorption spectrum (———) and photoluminescence spectrum (.....) of a polymer according to Example 17 of the present invention.
Figure 3O:
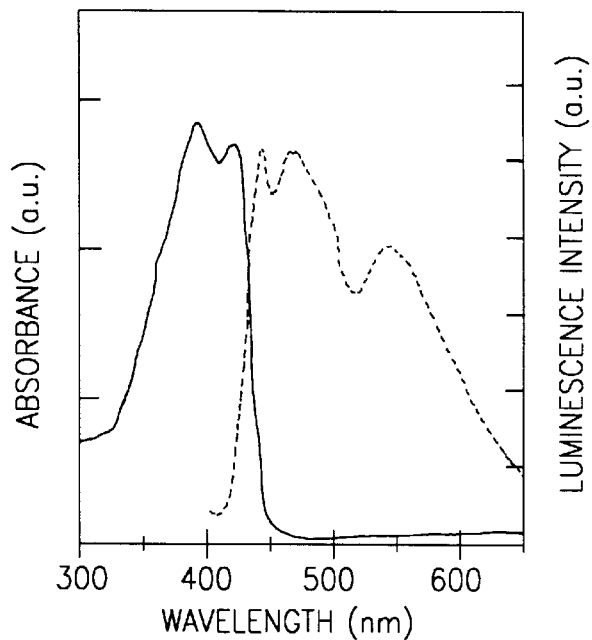
FIG. 3O shows the UV absorption spectrum (———) and photoluminescence spectrum (.....) of a polymer according to Example 18 of the present invention.
Figure 3P:
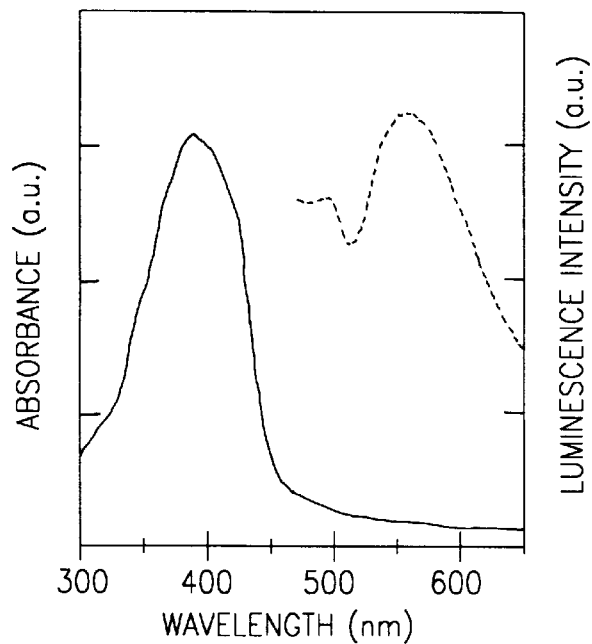
Figure 4A:
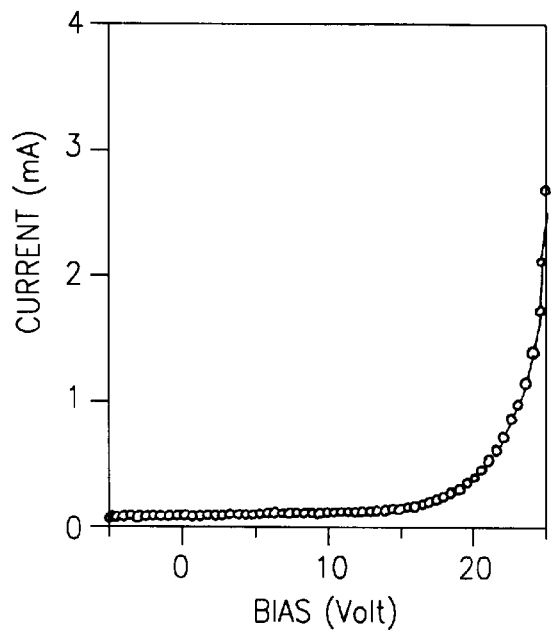
FIG. 4A shows the voltage-current characteristic curve of an LED formed of a polymer according to Example 4 of the present invention.
Figure 4B:
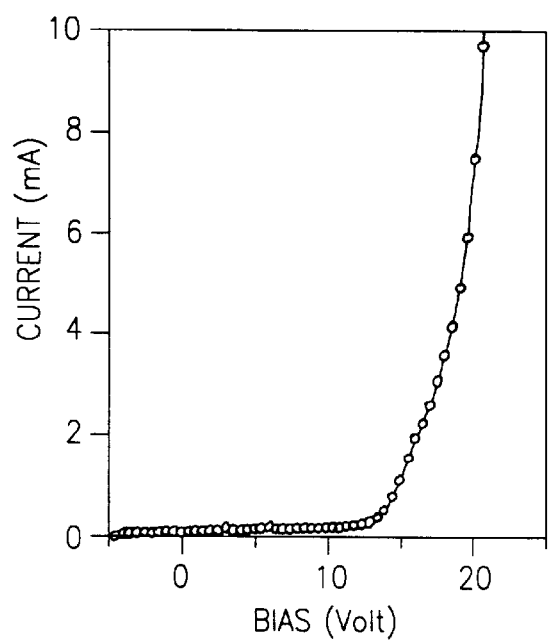
FIG. 4B shows the voltage-current characteristic curve of an LED formed of a polymer according to Example 5 of the present invention.
Figure 4C:
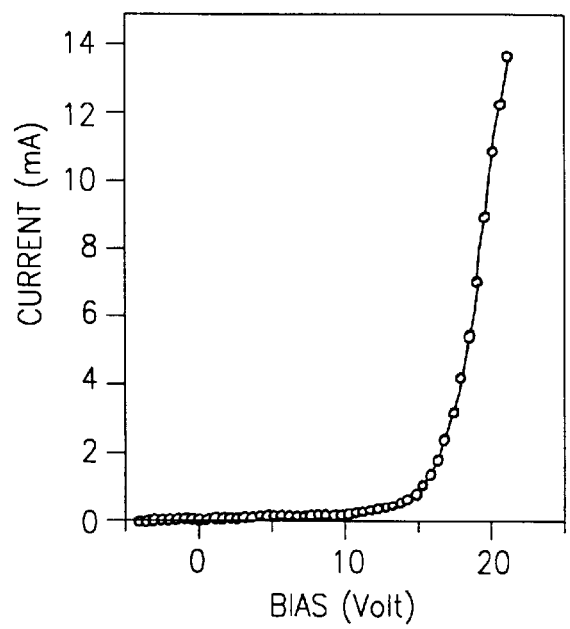
FIG. 4C shows the voltage-current characteristic curve of an LED formed of a polymer according to Example 6 of the present invention.
Figure 4D:
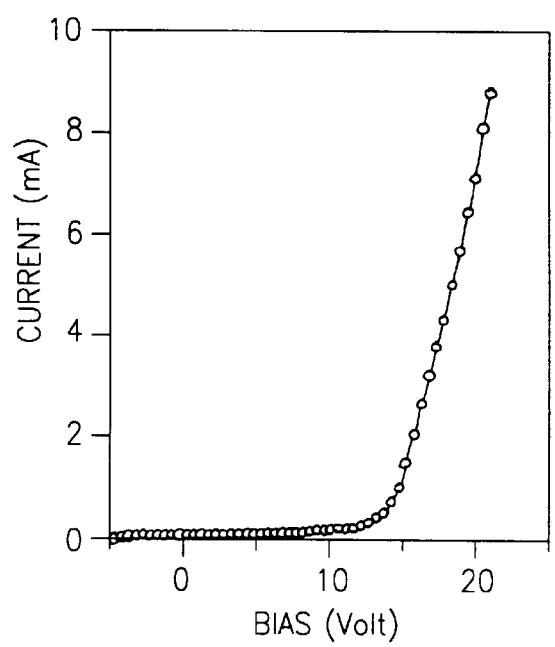
FIG. 4D shows the voltage-current characteristic curve of an LED formed of a polymer according to Example 7 of the present invention.
Figure 4E:
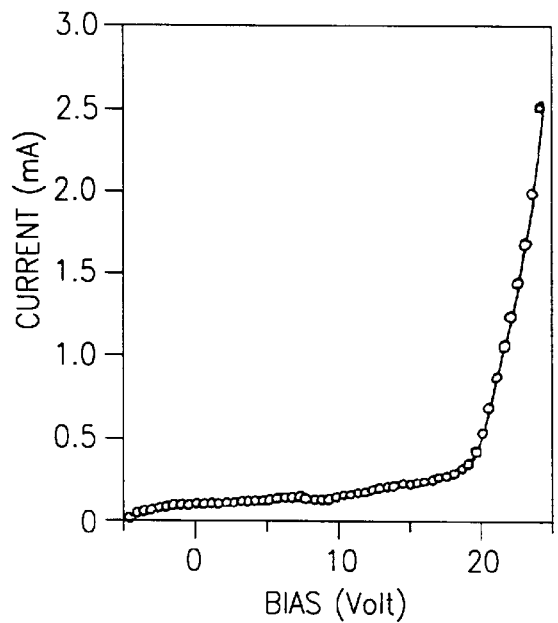
FIG. 4E shows the voltage-current characteristic curve of an LED formed of a polymer according to Example 8 of the present invention.
Figure 4F:
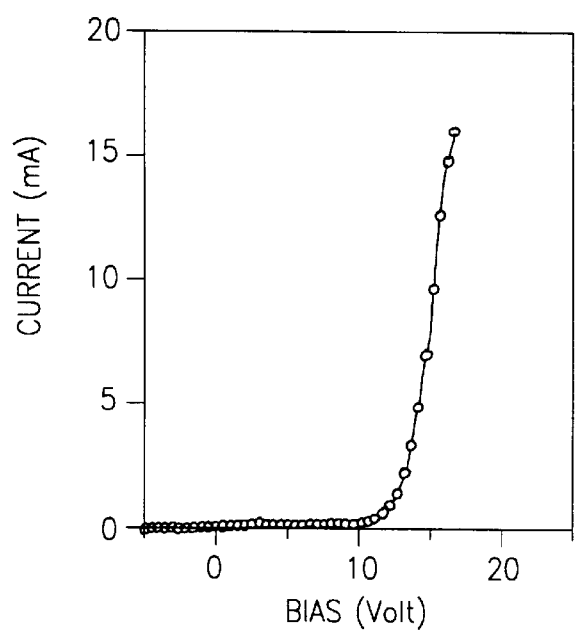
FIG. 4F shows the voltage-current characteristic curve of an LED formed of a polymer according to Example 9 of the present invention.
Figure 4G:
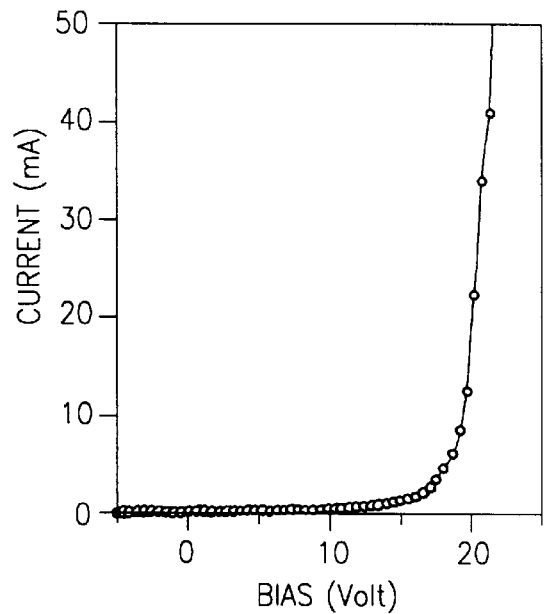
FIG. 4G shows the voltage-current characteristic curve of an LED formed of a polymer according to Example 10 of the present invention.
Figure 5A:
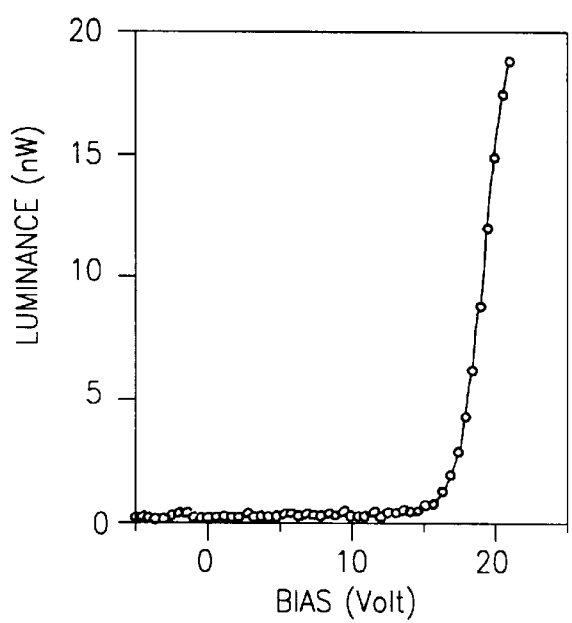
FIG. 5A shows the voltage-electroluminescence characteristic curve of an LED formed of a polymer according to Example 2 of the present invention.
Figure 5B:
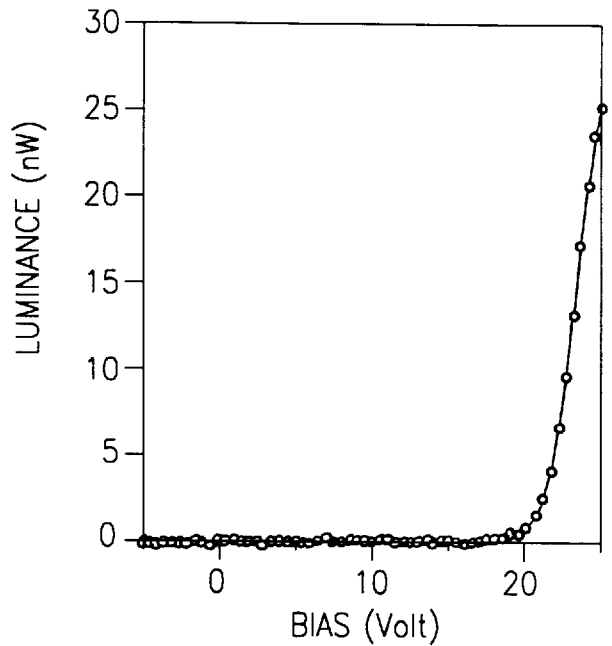
FIG. 5B shows the voltage-electroluminescence characteristic curve of an LED formed of a polymer according to Example 4 of the present invention.
Figure 5C:
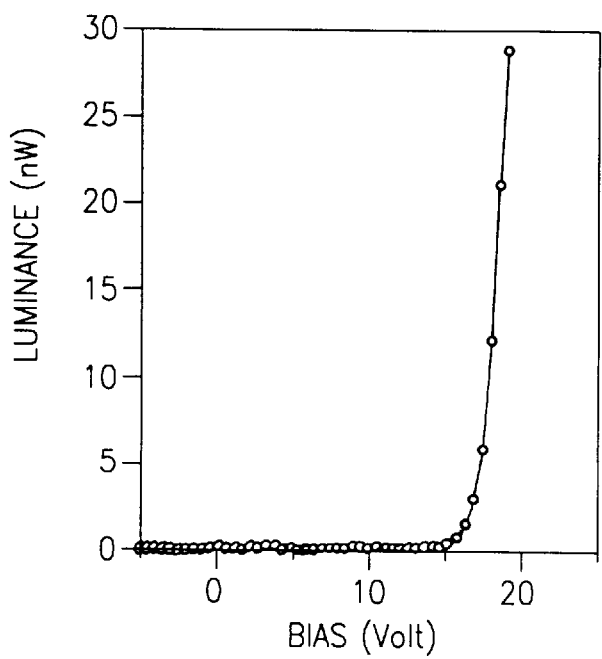
FIG. 5C shows the voltage-electroluminescence characteristic curve of an LED formed of a polymer according to Example 5 of the present invention.
Figure 5D:
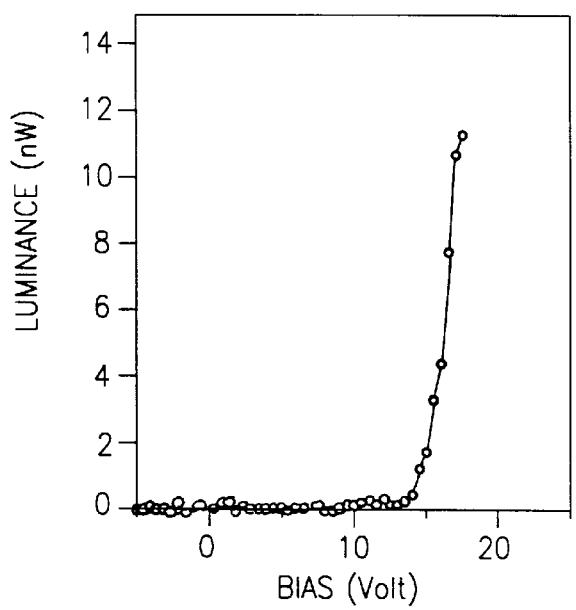
FIG. 5D shows the voltage-electroluminescence characteristic curve of an LED formed of a polymer according to Example 6 of the present invention.

The chemical structures of the above-described polymers are shown in Table 1, and the NMR spectra of the proton and the carbon-13 of the polymer as prepared in example 5 are shown in FIGS. 1 and 2, respectively.

TABLE 1

Examples  Molecular structure

Molecular structure (R$_1$ = R$_2$ = —(CH$_2$)$_5$CH$_3$) of polymers prepared in Examples 1 to 8

1,2

3,4

5

6

7

TMS = trimethyl silyl

8

Molecular structure (R$_1$ = R$_2$ = —(CH$_2$)$_5$CH$_3$) of polymers prepared in Examples 9 to 13

9

10

11

TABLE 1-continued

Examples  Molecular structure

12

13

Molecular structure (R$_1$ = R$_2$ = —(CH$_2$)$_5$CH$_3$) of polymers prepared in Examples 14 to 18

14

15

16

17

18

Ultraviolet Rat, Photoluminescence and Electroluminescence and EL Device Fabrication The ultraviolet (hereinafter called UV), Photoluminescence (hereinafter called PL), and Electroluminescence (hereinafter called EL) were obtained from a thin film which was fabricated using the polymers fabricated by the examples of the present invention, and an EL device was fabricated. Thereafter, the characteristic of the same was checked. 0.1 g of polymer was dissolved into chloroform solution of 5 ml and the resultant material was refined. Thereafter, the spin coating process was performed with respect to the thusly refined material as a spin speed was controlled so that the thickness of the thin film can have a thickness of about 100 nm. The coated sample material was dehydrated at room temperature, and the UV spectrum was obtained with respect thereto, and then the PL spectrum was obtained using a wavelength of the next UV peak maximum value. The thusly obtained values are shown in the following table 2.

TABLE 2

Physical characteristics of absorption wavelength, luminescence wavelength and thermal degradation temperature

| Examples | absorption wavelength (nm) | luminescence wavelength (nm) | $T_{deg.}$ (°C.)* |
|---|---|---|---|
| 1 | 386, 418 | 430, 483 | 391 |
| 2 | 388, 416 | 432, 481 | 388 |
| 3 | 392, 418 | 464, 540 | 397 |
| 4 | 390, 416 | 472, 548 | 390 |
| 5 | 388 | 474 | 362 |
| 6 | 360 | 476 | 374 |
| 7 | 386 | 495.535 | 344 |
| 8 | 408 | 483 | 342 |
| 9 | 354, 482 | 539 | 383 |
| 10 | 482 | 494, 540 | 389 |
| 11 | 366, 380 | 474 | 376 |
| 12 | 404 | 456, 487, 540 | 360 |
| 13 | 382 | 492 | 378 |
| 14 | 378 | 482 | 379 |
| 15 | 390, 420 | 442, 491, 539 | 365 |
| 16 | 390 | 483, 491, 532 | 366 |
| 17 | 390 | 441, 467, 544 | 373 |
| 18 | 390 | 553 | 370 |

*$T_{deg}$ is the temperature from which a decomposition of the polymer begins in a thermal gravimetric analysis.

As shown in Table 2, it seems that the said polymers emit light of various color tones depending on the kinds of polymer, considering the fact that such polymers show the PL peak maximum values (430~553 nanometers) in a broad area. The actual spectra thereof are shown in FIGS. 3-1 to 3-16.

Figure 6A:
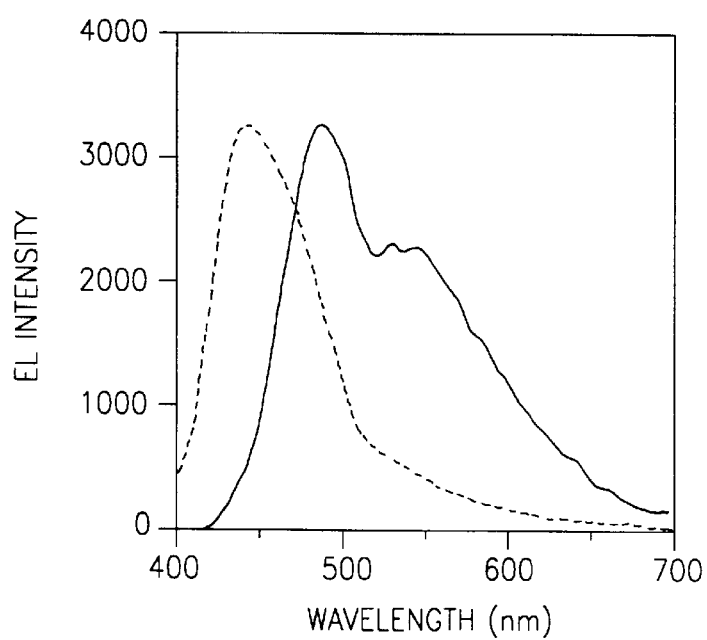
FIG. 6A shows the electroluminescence spectrum of the polymer (———) according to Example 2 of the present invention and the 1:4 blend (----) of the polymer and the polyvinylcarbazole according to Example 2 of the present invention.
Figure 6B:
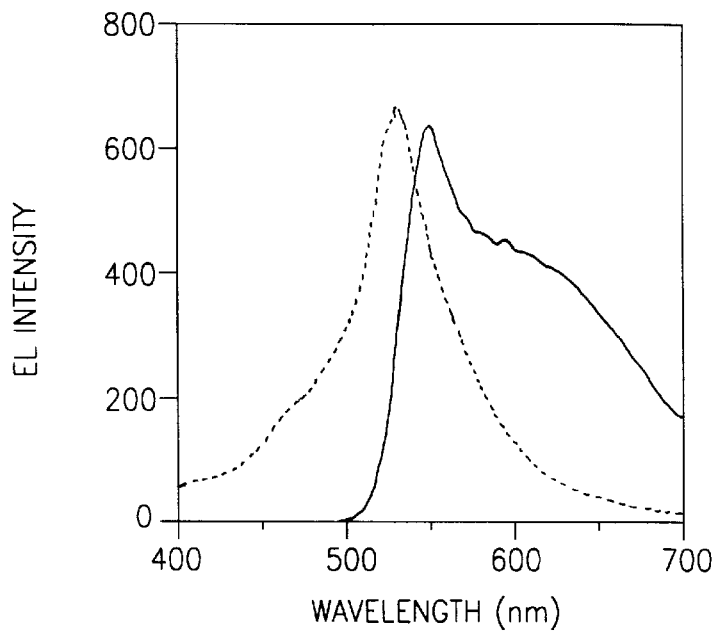
FIG. 6B shows the electroluminescence spectrum of the polymer (———) according to Example 2 of the present invention and the 1:4 blend (----) of the polymer and the polyvinylcarbazole according to Example 9 of the present invention.
Figure 7:
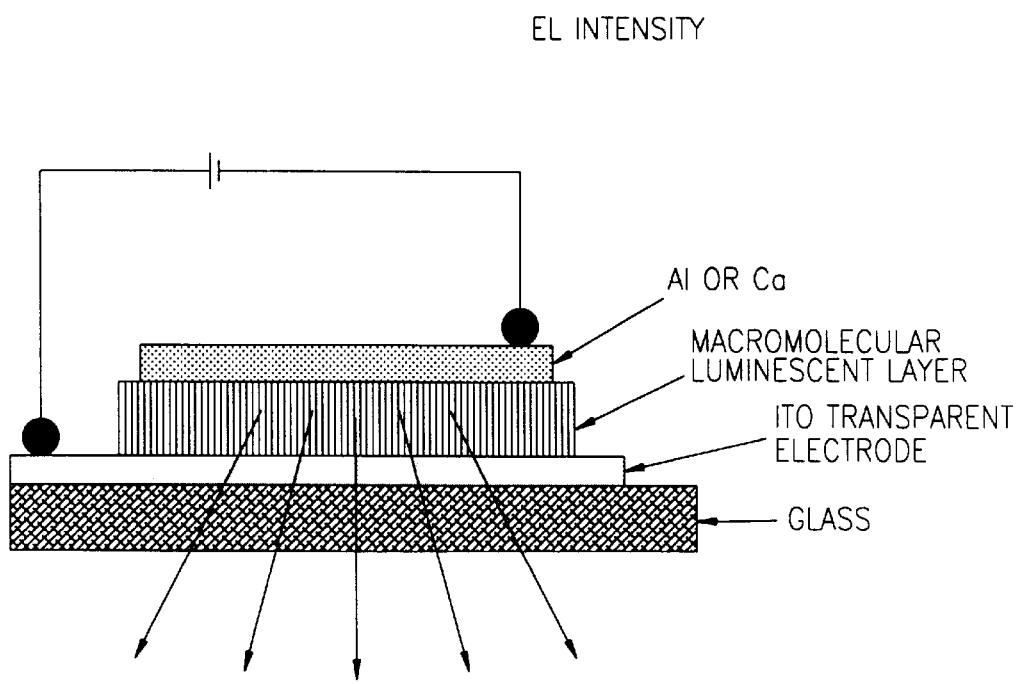
FIG. 7 shows the electroluminescence using a Fluorene-based Alternating Polymer as a luminescence layer according to the present invention.

An element consisting of the most generally used ITO/ luminescent layer/electrode was made to study the EL characteristics. In this case, as the luminescent layer that was used was the polymer manufactured according to the Examples, or those obtained by blending macromolecules for general use, as described in the present invention, for example, such as polyvinylcarbazole, polymethylmethacrylate, polystyrene, epoxy resin, etc., with the polymers of the present invention, in the present of the chloroform solvent, and as for the material for the electrodes, aluminum was selected. The elements were formed by a vacuum deposition of aluminum on a luminescent layer spin-coated to 100 nanometers on the ITO glass substrate, in the same manner as in the sample manufacturing method for measurement of the UV or PL spectrum. In order to find out the voltage/current characteristics of such EL elements, the variation of current was measured by changing the voltage from −5V to 25V or more if necessary. As shown in FIGS. 4-1 to 4-7, a critical voltage of between 10V to 20V was generally formed in the polymers of the present invention, which signifies that electroluminescence is produced at a voltage higher than such critical voltage. The voltage-electroluminescence characteristics are shown in FIGS. 5-1 to 5-4. For the purpose of analyzing electroluminescent light, the spectrum of light emitted through the ITO glass surface was measured by a spectroscope, and the luminescent color tones were defined by the wavelengths representing the maximum luminescence. The electroluminescent spectra are shown in FIGS. 6-1 to 6-2. The constitution of elements used in the present invention is shown schematically in FIG. 7.

The polymers prepared according to the examples of the present invention are applicable to fabricating LED which is an EL device. In addition, since the polymers according to the examples of the present invention are optically and electrically active material, they have a PL characteristic and non-linear optical characteristic as well as an optical and electrical conductivity characteristic. Therefore, the polymers according to the examples of the present invention are well applicable for fabricating an optical switch, module, waveguide, and optical absorption material.

What is claimed is:

1. A fluorene-based alternating polymer used for luminescent materials of electroluminescent elements, indicated by the following formula (I):

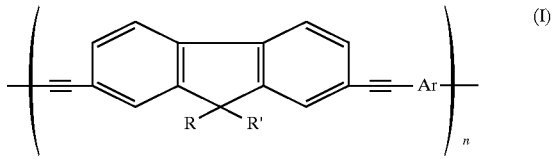

wherein R and R' which may be identical or different, represent hydrogen; aliphatic or alicyclic alkyl or alkoxy groups containing 1 to 22 carbon atoms, or aryl or aryloxy group containing 6 to 18 carbon atoms such as methyl, ethyl, propyl, isopropyl, butyl, isobutyl, pentyl, hexyl, ethylhexyl, heptyl, octyl, isooctyl, nonyl, decyl, dodecyl, hexadecyl, octadecyl, docodecyl, cyclopropyl, cyclopentyl, cyclohexyl, methoxy, ethoxy, butoxy, hexyloxy, methoxyethoxyethyl, methoxyethoxyethoxyethyl, phenyl, phenoxy, tolyl, benzyl, naphthyl and anthracene groups; alkyl or aryl derivatives of silicon, tin or germanium such as trimethylsilyl, triphenylsilyl, tributyltin, or triethylgermanium;

Ar represents phenyl which may be unsubstituted or substituted with aliphatic or alicyclic alkyl or alkoxy having 1 to 22 carbons; diphenyl, diphenylether, diphenylsulfide, diphenylamine, fluorene, terphenyl, naphthalene, anthracene, phenanthrene; heterocyclic compound such as pyridine, furan, thiophene, alkylthiophene, dithiophene, pyrrole, dipyrrole, dipyrrolemethane, dibenzofuran, dibenzothiophene, diphenyloxadiazole, diphenylthiadiazole, carbazole, diphenylmethane, diphenylsilane, bisformylphenoxyalkane and isomers or derivatives thereof;

n denotes an integer greater than or equal to 1.

2. An electroluminescent element consisting of anode/ luminescent layer/cathode or anode/hole transporting layer/ luminescent layer/electron transporting layer/cathode, characterized in that a light emitting materials of the luminescent layer is a fluorene-based alternating polymer of formula (I):

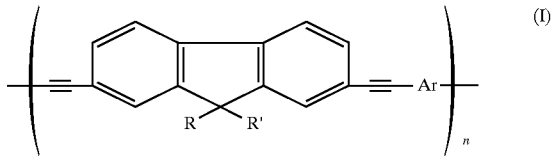

wherein R and R' which may be identical or different, represent hydrogen; aliphatic or alicyclic alkyl or alkoxy groups containing 1 to 22 carbon atoms, or aryl or aryloxy group containing 6 to 18 carbon atoms such as methyl, ethyl, propyl, isopropyl, butyl, isobutyl, pentyl, hexyl, ethylhexyl, heptyl, octyl, isooctyl, nonyl, decyl, dodecyl, hexadecyl, octadecyl, docodecyl, cyclopropyl, cyclopentyl, cyclohexyl, methoxy, ethoxy, butoxy, hexyloxy, methoxyethoxyethyl, methoxyethoxyethoxyethyl, phenyl, phenoxy, tolyl, benzyl, naphthyl and anthracene groups; alkyl or aryl derivatives of silicon, tin or germanium such as trimethylsilyl, triphenylsilyl, tributyltin, or triethylgermanium;

Ar represents phenyl which may be unsubstituted or substituted with aliphatic or alicyclic alkyl or alkoxy having 1 to 22 carbons; diphenyl, diphenylether, diphenylsulfide, diphenylamine, fluorene, terphenyl, naphthalene, anthracene, phenanthrene; heterocyclic compound such as pyridine, furan, thiophene, alkylthiophene, dithiophene, pyrrole, dipyrrole, dipyrrolemethane, dibenzofuran, dibenzothiophene, diphenyloxadiazole, diphenylthiadiazole, carbazole, diphenylmethane, diphenylsilane, bisformylphenoxy-alkane and isomers or derivatives thereof;

n denotes an integer greater than or equal to 1.

3. The electroluminescent element according to claim 2, characterized in that the light emitting materials of the luminescent layer are materials in which the fluorene-based alternating polymer having the formula (I) and commercial polymers are blended together.

4. The electroluminescent element according to claim 3, characterized in that the commercial polymers are selected from the group comprising of polyvinylcarbazole, polymethyl methacrylate, polystyrene and epoxy resin.

5. The electroluminescent element according to claim 3, characterized in that the fluorene-based alternating polymer having the formula (I) is blended in the amount of 0.1 to 99.9 weight % based on the amount of the commercial polymers.

* * * * *